US012595972B2

(12) United States Patent
Uekubo

(10) Patent No.: US 12,595,972 B2
(45) Date of Patent: Apr. 7, 2026

---

(54) HEAT PIPE

(71) Applicant: FURUKAWA ELECTRIC CO., LTD., Tokyo (JP)

(72) Inventor: Masahiro Uekubo, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/914,005

(22) Filed: Jun. 26, 2020

(65) Prior Publication Data

US 2020/0326135 A1 Oct. 15, 2020

Related U.S. Application Data

(63) Continuation of application No. PCT/JP2018/047920, filed on Dec. 26, 2018.

(30) Foreign Application Priority Data

| Dec. 28, 2017 | (JP) | 2017-253210 |
| Mar. 2, 2018 | (JP) | 2018-037959 |

(51) Int. Cl.
*F28D 15/04* (2006.01)
*F28D 15/02* (2006.01)
*H05K 7/20* (2006.01)

(52) U.S. Cl.
CPC ....... *F28D 15/046* (2013.01); *F28D 15/0233* (2013.01); *F28D 15/0275* (2013.01); *F28F 2255/18* (2013.01); *H05K 7/20336* (2013.01)

(58) Field of Classification Search
CPC .............. F28D 15/046; F28D 15/0233; F28D 15/0275; F28F 21/08; F28F 2255/18; H05K 7/20336

(Continued)

(56) References Cited

U.S. PATENT DOCUMENTS

| 4,018,269 A | * | 4/1977 | Honda | .................. | F28D 15/046 |
| | | | | | 165/104.26 |
| 4,274,479 A | * | 6/1981 | Eastman | ............... | F28D 15/046 |
| | | | | | 29/890.032 |

(Continued)

FOREIGN PATENT DOCUMENTS

| CN | 1627031 A | 6/2005 |
| CN | 1725479 A | * 1/2006 |

(Continued)

OTHER PUBLICATIONS www.intechopen.com Porous Structures in Heat Pipes, by Patrick Nemec (Year: 2017).*

(Continued)

*Primary Examiner* — Len Tran
*Assistant Examiner* — Gustavo A Hincapie Serna
(74) *Attorney, Agent, or Firm* — Birch, Stewart, Kolasch & Birch, LLP

(57) ABSTRACT

An object of the present disclosure is to provide a heat pipe having a good maximum heat transfer rate and capable of reducing thermal resistance and exhibiting excellent heat transfer characteristics even when the heat pipe is installed in the top heat position. The heat pipe includes: a container having a sealed internal space; a wick structure obtained by sintering metal fibers and disposed on an inner surface of the container; and a working fluid sealed in the internal space of the container, wherein the metal fibers include metal fibers having a fiber length of not less than 0.50 mm but not more than 1.8 mm, and a fiber diameter of not less than 10 μm but not more than 50 μ m.

10 Claims, 8 Drawing Sheets

(58) Field of Classification Search
USPC .................................................... 165/104.26
See application file for complete search history.

(56) References Cited

U.S. PATENT DOCUMENTS

| | | | | |
|---|---|---|---|---|
| 6,648,063 B1* | 11/2003 | Andraka | ............... | F28D 15/046 165/104.26 |
| 7,086,454 B1* | 8/2006 | Hsu | ..................... | F28D 15/046 165/104.33 |
| 7,316,264 B2* | 1/2008 | Lai | ....................... | F28D 15/046 165/104.21 |
| 7,845,394 B2* | 12/2010 | Chang | ................... | F28D 15/046 165/104.26 |
| 9,897,392 B2* | 2/2018 | Wang | ..................... | B23P 15/26 |
| 11,415,373 B2* | 8/2022 | Inagaki | .................... | B22F 5/10 |
| 2003/0141045 A1* | 7/2003 | Oh | ........................ | F28D 15/046 165/104.26 |
| 2006/0169439 A1* | 8/2006 | Hong | ................... | F28D 15/046 165/104.26 |
| 2006/0207750 A1* | 9/2006 | Chang | ................... | F28D 15/046 165/104.33 |
| 2006/0225282 A1* | 10/2006 | Chung | ................. | H01L 23/427 29/890.032 |
| 2006/0283574 A1* | 12/2006 | Huang | ................. | F28D 15/046 165/104.26 |
| 2007/0240855 A1* | 10/2007 | Hou | ..................... | F28D 15/046 165/104.26 |
| 2007/0240858 A1* | 10/2007 | Hou | ..................... | F28D 15/046 165/146 |
| 2007/0246194 A1* | 10/2007 | Hou | ..................... | F28D 15/046 165/104.26 |
| 2007/0267178 A1* | 11/2007 | Hou | ..................... | F28D 15/046 165/146 |
| 2007/0295484 A1* | 12/2007 | Tsai | ........................ | F28F 23/00 165/104.21 |
| 2008/0142196 A1* | 6/2008 | Jeng | ..................... | F28D 15/046 165/104.26 |
| 2009/0020269 A1* | 1/2009 | Chang | ................... | F28D 15/046 165/104.26 |
| 2009/0173475 A1* | 7/2009 | Hsiao | ................... | F28D 15/046 165/104.33 |
| 2009/0321053 A1 | 12/2009 | Tegrotenhuis et al. | | |
| 2010/0084113 A1 | 4/2010 | Lee | | |
| 2010/0181048 A1* | 7/2010 | Hwang | ................. | F28D 15/046 165/104.26 |
| 2010/0212870 A1* | 8/2010 | Wu | ....................... | H01L 23/427 165/104.26 |
| 2010/0263833 A1* | 10/2010 | Lee | ...................... | F28D 15/046 165/104.26 |
| 2012/0175084 A1* | 7/2012 | Horng | .................. | F28D 15/046 165/104.26 |
| 2012/0227934 A1* | 9/2012 | Huang | .................. | F28D 15/046 29/890.032 |
| 2012/0325440 A1 | 12/2012 | Honmura et al. | | |
| 2013/0014919 A1* | 1/2013 | Dai | ...................... | F28D 15/046 165/104.26 |
| 2013/0043004 A1* | 2/2013 | Wang | .................... | F28D 15/046 29/890.032 |
| 2013/0048249 A1* | 2/2013 | Lin | ....................... | F28D 15/046 29/890.032 |
| 2013/0105131 A1* | 5/2013 | Chen | .................... | F28D 15/046 165/177 |
| 2013/0174966 A1* | 7/2013 | He | ......................... | B22F 7/002 156/89.11 |
| 2013/0213611 A1* | 8/2013 | Wu | ..................... | F28D 15/0233 165/104.26 |
| 2013/0306275 A1* | 11/2013 | Yang | ....................... | F28D 15/02 165/104.11 |
| 2014/0055954 A1* | 2/2014 | Wu | .................... | F28D 15/0233 165/104.26 |
| 2014/0166246 A1* | 6/2014 | Dai | ....................... | F28D 15/046 29/890.032 |
| 2014/0174086 A1* | 6/2014 | Kare | .................... | H02K 7/1823 60/670 |
| 2015/0204617 A1* | 7/2015 | Thanhlong | .......... | F28D 15/0233 165/104.26 |
| 2016/0014931 A1* | 1/2016 | Hamakawa | ........ | H05K 7/20336 165/104.26 |
| 2016/0153720 A1* | 6/2016 | Huang | .................. | F28D 15/046 165/104.21 |
| 2017/0122673 A1* | 5/2017 | Chin | ..................... | H01L 23/427 |
| 2017/0153072 A1 | 6/2017 | Saiwai et al. | | |
| 2017/0160018 A1* | 6/2017 | Tseng | .................... | F28D 15/046 |
| 2017/0234624 A1* | 8/2017 | Cai | ....................... | F28D 15/046 165/104.26 |
| 2017/0363367 A1 | 12/2017 | Yeh et al. | | |
| 2020/0141659 A1* | 5/2020 | Inagaki | .................. | F28F 21/08 |

FOREIGN PATENT DOCUMENTS

| | | | | |
|---|---|---|---|---|
| CN | 101542226 A | | 9/2009 | |
| CN | 102345994 A | | 2/2012 | |
| CN | 202221259 U | | 5/2012 | |
| CN | 203672209 U | | 6/2014 | |
| CN | 106197106 A | * | 12/2016 | ........... F28D 15/046 |
| CN | 106643246 A | | 5/2017 | |
| CN | 106662409 A | | 5/2017 | |
| CN | 206772103 U | | 12/2017 | |
| JP | 2002-372387 A | | 12/2002 | |
| JP | 3164517 U | | 12/2010 | |
| JP | 3175037 U | | 4/2012 | |
| JP | 2013-100977 A | | 5/2013 | |
| JP | 2014-81185 A | | 5/2014 | |
| JP | 2015-121373 A | | 7/2015 | |
| JP | 2016-14508 A | | 1/2016 | |
| JP | 3206683 U | | 9/2016 | |
| JP | 2016-194118 A | | 11/2016 | |
| WO | WO 2002/044639 A1 | | 6/2002 | |
| WO | WO 2014/157147 A1 | | 10/2014 | |

OTHER PUBLICATIONS

Demec Porous Structures in Heat Pipes www.intechopen.com (Year: 2017).*

Nemec Porous Structures in Heat Pipes www.intechopen.com (year:2017) (Year: 2017).*

International Preliminary Report on Patentability and English translation of the Written Opinion of the International Searching Authority (forms PCT/IB/373 and PCT/ISA/237), dated Jun. 30, 2020, for corresponding International Application No. PCT/JP2018/047920.

International Search Report for PCT/JP2018/047920 (PCT/ISA/210) mailed on Mar. 19, 2019.

Notice of Allowance dated Feb. 15, 2020, in a corresponding TW application No. 107147647.

Office Action (final rejection) dated Nov. 18, 2019, in a corresponding JP application No. 2019-529675.

Office Action dated Aug. 26, 2019, in a corresponding JP application No. 2019-529675.

Office Action dated Oct. 14, 2019, in a corresponding TW application No. 107147647.

Reconsideration Report before Appeal in a corresponding JP application No. 2019-529675 dated Mar. 18, 2020.

Written Opinion of the International Searching Authority for PCT/JP2018/047920 (PCT/ISA/237) mailed on Mar. 19, 2019.

Chinese Office Action and Search Report for corresponding Chinese Application No. 201880084453.3, dated Mar. 11, 2021, with English translation.

Japanese Office Action for Japanese Application No. 2020-016902, dated Aug. 23, 2022, including an English translation.

* cited by examiner

HEAT PIPE

CROSS REFERENCE TO RELATED APPLICATIONS

The present application is a continuation application of International Patent Application No. PCT/JP2018/047920 filed on Dec. 26, 2018, which claims the benefit of Japanese Patent Application No. 2017-253210, filed on Dec. 28, 2017 and the benefit of Japanese Patent Application No. 2018-037959, filed on Mar. 2, 2018. The contents of these applications are incorporated herein by reference in their entirety.

BACKGROUND

Technical Field

The present disclosure relates to a heat pipe having a good maximum heat transfer rate and a small thermal resistance, and having excellent heat transfer characteristics even in a top heat state.

Background

The amount of heat generated by electronic parts such as semiconductor devices mounted in electric and electronic equipment, such as a desk top personal computers and servers, is on increase due to high-density mounting associated with higher functions, and it is increasingly important to cool the electronic parts. As a method of cooling the electronic parts, a heat pipe may be used. Also, due to downsizing of electric and electronic equipment, the heat pipe may be installed in a so-called top heat position so that an evaporating side is positioned higher than a condensing side.

Then, as a heat pipe which reduces a decline in the heat transfer rate even when the heat pipe is installed in the top heat position, there was proposed a heat transfer body in which a working fluid was hermetically sealed, and a vapor flow path and a wick for refluxing of the working fluid were formed, the wick being made of a non-woven fabric (Japanese Patent Application Publication No. 2002-372387). In Japanese Patent Application Publication No. 2002-372387, by making the wick from a non-woven fabric with non-uniform texture, the setting range of working fluid reflux force of the wick can be widened, and consequently the working fluid reflux force of the wick is improved.

However, since the amount of heat generated by electronic parts to be cooled is on the increase, there is still a room for improvement in the maximum heat transfer rate and a reduction of thermal resistance in the top heat state in Japanese Patent Application Publication No. 2002-372387.

SUMMARY

In view of the above circumstances, it is an object of the present disclosure to provide a heat pipe having a good maximum heat transfer rate and capable of reducing thermal resistance and exhibiting excellent heat transfer characteristics even if the heat pipe is installed in the top heat position.

One aspect of the present disclosure is a heat pipe including: a container having a sealed internal space; a wick structure obtained by sintering metal fibers and disposed on an inner surface of the container; and a working fluid sealed in the internal space of the container, wherein the metal fibers include metal fibers having a fiber length of not less than 0.50 mm but not more than 1.8 mm, and a fiber diameter of not less than 10 μm but not more than 50 μm.

In the heat pipe according to an aspect of the present disclosure, the metal fibers have an average fiber length of not less than 0.50 mm but not more than 1.8 mm, and an average fiber diameter of not less than 10 μm but not more than 50 μm.

In the heat pipe according to an aspect of the present disclosure, the wick structure has a porosity of not less than 70% but not more than 86%.

In the heat pipe according to the aspect, the metal fibers are at least one metal species selected from the group consisting of copper, copper alloys, aluminum, aluminum alloys, titanium, titanium alloys and stainless steel.

In the heat pipe according to an aspect of the present disclosure, the container has a planar shape or a tubular shape.

In the heat pipe according to an aspect of the disclosure, the container is made of metal, and a metal species of the container is the same as a metal species of the metal fibers.

In the heat pipe according to an aspect of the present disclosure, the container is a bare tube. In the above aspect, a tube with a smooth inner surface is used as the container.

In the heat pipe according to an aspect of the present disclosure, the container is a grooved tube. In the above aspect, a tube material having a plurality of thin grooves extending on the inner surface along a longitudinal direction of the container is used as the container.

In the heat pipe according to an aspect of the present disclosure, the wick structure extends from one end portion to another end portion in the longitudinal direction of the container.

In the heat pipe according to an aspect of the present disclosure, the wick structure is disposed in a part in the longitudinal direction of the container.

The heat pipe according to an aspect of the present disclosure, includes the wick structure disposed in a part in the longitudinal direction of the container, and another wick structure obtained by sintering a metal powder and disposed in another part in the longitudinal direction of the container.

The heat pipe according to an aspect of the present disclosure, has a wick part including the wick structure disposed in a part in the longitudinal direction of the container and another wick structure obtained by sintering a metal powder, disposed in another part in the longitudinal direction of the container and connected to the wick structure in the longitudinal direction of the container, wherein the wick part extends from one end portion to another end portion in the longitudinal direction of the container.

In the heat pipe according to an aspect of the present disclosure, the wick structure is connected to the other wick structure in the longitudinal direction of the container.

In the heat pipe according to an aspect of the present disclosure, the container is a grooved tube and includes the other wick structure in a heat receiving portion, and the wick structure in a heat insulating portion which is an intermediate portion between the heat receiving portion and a heat radiating portion.

In the heat pipe according to an aspect of the present disclosure, the container is a grooved tube, and includes the other wick structure in the heat receiving portion. In the heat pipe according to an aspect of the present disclosure, a shape of a vapor flow path in a cross section in a direction orthogonal to the longitudinal direction of the container in a region of the other wick structure has, at least in part, a flow petal shape, a star shape, a polygonal shape or a gear shape.

In the heat pipe according to an aspect of the present disclosure, an average thickness of the other wick structure in a direction orthogonal to the longitudinal direction of the container decreases with distance from the heat insulating portion toward the heat receiving portion. In the heat pipe according to an aspect of the present disclosure, an average thickness of the other wick structure in a direction orthogonal to the longitudinal direction of the container decreases with distance from one connected end connected to the wick structure toward another end opposite the one connected end.

According to an aspect of the present disclosure, since the wick structure, which is formed by sintering metal fibers including metal fibers having a fiber length of not less than 0.50 mm but not more than 1.8 mm, and a fiber diameter of not less than 10 μm but not more than 50 μm, is contained in the container, even if the heat pipe is installed in the top heat position, the heat pipe has a good maximum heat transfer rate and can further reduce thermal resistance, and thus it is possible to obtain the heat pipe which exhibits excellent heat transfer characteristics.

According to an aspect of the present disclosure, when the porosity of the wick structure is not less than 70% but not more than 84%, it is possible to further reduce thermal resistance while further improving the maximum heat transfer rate.

According to an aspect of the present disclosure, since the metal species of the container and the metal species of the metal fibers are the same, it is possible to further reduce the thermal resistance between the container and the wick structure.

DETAILED DESCRIPTION

Figure 1:
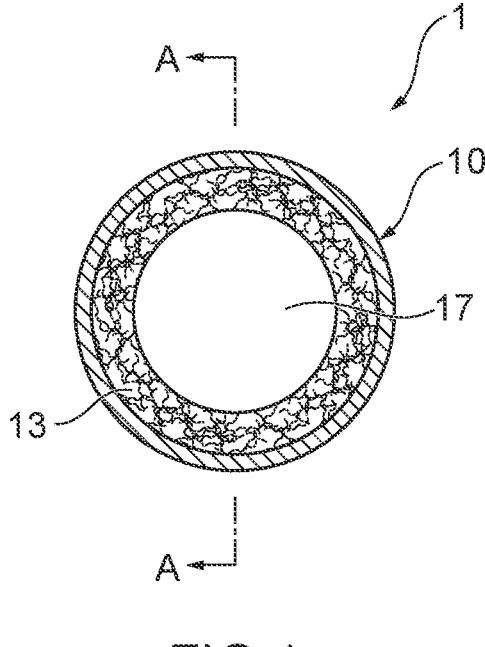
FIG. 1 A front sectional view of a heat pipe according to a first embodiment of the present disclosure.

Hereinafter, a heat pipe according to the first embodiment of the present disclosure will be described using FIGS. 1 and 2. FIG. 1 is a front sectional view of the heat pipe according to the first embodiment of the present disclosure, and FIG. 2 is the A-A cross-sectional view of FIG. 1, describing a side cross-section of the heat pipe according to the first embodiment of the present disclosure.

Figure 2:
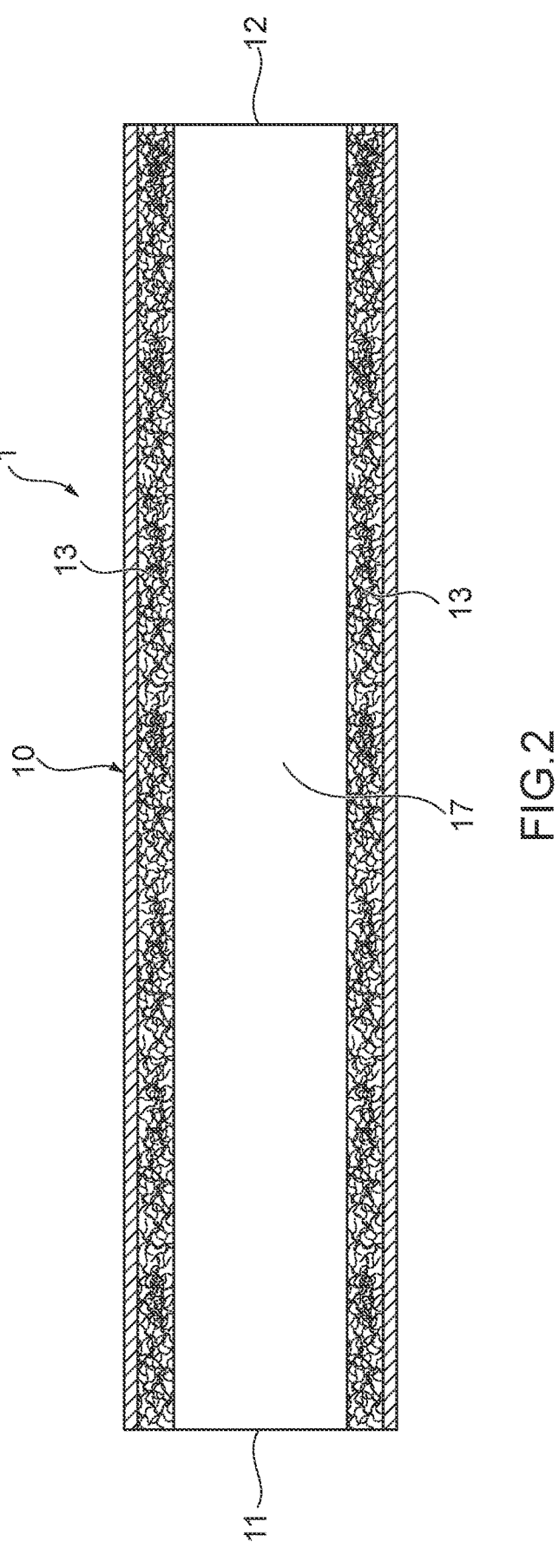
FIG. 2 An A-A cross-sectional view of FIG. 1, describing a side cross-section of the heat pipe according to the first embodiment of the present disclosure.

As shown in FIGS. 1 and 2, a heat pipe 1 according to the first embodiment of the present disclosure includes: a tubular-shaped container 10 in which an end face of one end portion 11 and an end face of another end portion 12 are sealed; a wick structure 13 disposed on an inner surface of the container 10; and a working fluid (not shown) sealed in a cavity portion 17 which is an internal space of the container 10.

The container 10 is a sealed tube material. The longitudinal shape of the container 10 is not particularly specified to a linear shape, a shape having a curved portion, etc., but is substantially linear in the heat pipe 1. A cross sectional shape in a direction orthogonal to the longitudinal direction of the container 10 is not particularly specified to a circular shape, a flat shape, a polygonal shape such as a square shape, etc., but is substantially circular in the heat pipe 1. The thickness of the container 10 is not particularly limited, but is, for example, 50 μm to 1000 μm. The dimension in a radial direction of the substantially circular container 10 is not particularly limited, but is, for example, 5 mm to 20 mm. Further, in the heat pipe 1, the container 10 may be a bare tube having a smooth inner surface, or a grooved tube having an inner surface provided with a plurality of thin grooves extending along the longitudinal direction of the container 10 and provided with a capillary force.

As shown in FIG. 2, a wick structure 13 is disposed on the inner surface of the container 10 from one end portion 11 to another end portion 12 along the longitudinal direction of the container 10. That is, the wick structure 13 extends in the longitudinal direction of the container 10. Moreover, as shown in FIG. 1, in the heat pipe 1, the wick structure 13 is formed on the entire inner peripheral surface in the radial direction of the container 10. Thus, the inner peripheral surface that forms the longitudinal direction of the container 10 is covered with the wick structure 13 in the form of a layer.

The wick structure 13 is a sintered body obtained by sintering metal fibers. Therefore, a metal fiber material is used as a raw material for the wick structure 13. The wick structure 13 is in a form in which metal fibers are sintered and solidified while maintaining the fiber state. The metal fibers constituting the sintered body include metal fibers having a fiber length ranging from not less than 0.50 mm to not more than 1.8 mm, and a fiber diameter ranging from not less than 10 μm to not more than 50 μm. Since the wick structure 13 includes metal fibers in the above-mentioned fiber length range and fiber diameter range, even if the heat pipe 1 is installed in the top heat position, the wick structure 13 provides good capillary force, has a good maximum heat transfer rate and can further reduce thermal resistance. Thus, it is possible to exhibit excellent heat transfer characteristics. It should be noted that the fiber length is the length when the metal fiber is straightened.

The wick structure 13 is not particularly limited as long as the wick structure 13 includes metal fibers having a fiber length of not less than 0.50 mm but not more than 1.8 mm, and a fiber diameter of not less than 10 μm but not more than 50 μm, but, from the viewpoint of reliably reducing the thermal resistance while certainly improving the maximum heat transfer rate, it is preferable that the metal fibers constituting the wick structure have an average fiber length ranging from not less than 0.50 mm to not more than 1.8 mm, and an average fiber diameter ranging from not less than 10 μm to not more than 50 μm. Moreover, from the viewpoint of reliably reducing the thermal resistance while certainly improving the maximum heat transfer rate, it is preferable that the wick structure 13 include metal fibers having a fiber length ranging from not less than 0.80 mm to not more than 1.5 mm, and a fiber diameter ranging from not less than 20 μm to not more than 40 μm, and it is particularly preferable that the metal fibers constituting the wick structure 13 have an average fiber length ranging from not less than 0.80 mm to not more than 1.5 mm, and an average fiber diameter ranging from not less than 20 μm to not more than 40 μm.

The fiber length and the fiber diameter of the metal fibers of the wick structure 13 as a sintered body of metal fibers can be adjusted by using a metal fiber material corresponding to the fiber length and the fiber diameter of the sintered body as a raw material of the sintered body.

The porosity of the wick structure 13 is not particularly limited, but, for example, from the viewpoint of further reducing the thermal resistance while further improving the maximum heat transfer rate, the porosity is preferably in a range from not less than 70% to not more than 86%, and particularly preferably in a range from not less than 75% to not more than 85%. The range of the porosity of the wick structure 13 can be adjusted by the fiber length and the fiber diameter of the metal fiber and the filling degree of the metal fibers. The porosity of the wick structure can be calculated from the mass and volume of the wick structure.

As shown in FIGS. 1 and 2, the internal space of the container 10 is a cavity portion 17, and the cavity portion 17 serves as a vapor flow path to circulate a working fluid in the gas phase. That is, on the inner peripheral surface in the longitudinal direction of the container 10, the surface of the wick structure 13, which is a sintered layer of metal fibers, serves as a wall surface of the vapor flow path.

The material of the container 10 is not particularly limited, and, it is possible to use, for example, copper and copper alloys from the viewpoint of excellent thermal conductivity, aluminum and aluminum alloys from the viewpoint of lightness, stainless steel from the viewpoint of improvement in strength, etc. Further, tin, tin alloys, titanium, titanium alloys, nickel and nickel alloys, etc. may be used depending on the conditions of use.

The metal species of the metal fibers constituting the wick structure 13 is not particularly limited, and examples include copper, copper alloys, aluminum, aluminum alloys, stainless steel, tin, tin alloys, titanium, titanium alloys, nickel, and nickel alloys. These metals may be used alone or in combination of two or more types. The metal species of the metal fibers and the metal species of the container 10 may be the same or different, but, from the viewpoint of further reducing the thermal resistance between the container 10 and the wick structure 13, it is preferable that the metal species of the metal fibers and the metal species of the container 10 be the same.

The working fluid to be sealed in the container 10 can be appropriately selected according to the compatibility with the material of the container 10, and can be, for example, water, a fluorocarbon substitute, perfluorocarbon, and cyclopentane, and also the working fluid can be antifreeze.

Next, the heat transfer mechanism of the heat pipe 1 according to the first embodiment of the present disclosure will be described. When the heat pipe 1 receives heat from a heat generating device (not shown) which is thermally connected at one end portion 11 located at a position higher than another end portion 12, the one end portion 11 functions as an evaporating portion (heat receiving portion), and the working fluid undergoes a phase change from the liquid phase to the gas phase in the evaporating portion. The working fluid that has undergone a phase change to the gas phase flows in the vapor flow path as the cavity portion 17 from the evaporating portion to a condensing portion (heat dissipating section) as the other end portion 12 along the longitudinal direction of the container 10, that is, from the upper side to the lower side in the gravity direction, whereby the heat from the heat generating device is transferred from the evaporating portion to the condensing portion. The heat from the heat generating device which has transferred from the evaporating portion to the condensing portion is released as latent heat by a phase change of the working fluid in the gas phase to the liquid phase in the condensing portion provided with heat exchange means (not shown). The latent heat which has released at the condensing portion is released from the condensing portion to an external environment of the heat pipe 1 through the heat exchange means provided in the condensing portion. In addition, the working fluid which has undergone a phase change to the liquid phase in the condensing portion is refluxed by the capillary force of the wick structure 13 from the condensing portion to the evaporating portion, that is, from the lower side to the upper side in the gravity direction.

In the heat pipe 1 according to the first embodiment, since the wick structure 13 includes metal fibers having a fiber length of not less than 0.50 mm but not more than 1.8 mm, and a fiber diameter of not less than 10 μm but not more than 50 μm, it is possible to reduce the resistance in the flow path compared with the sintered body obtained by sintering a metal powder, and even if the heat pipe 1 is installed in the top heat position, the heat pipe 1 has a good maximum heat transfer rate and can further reduce the thermal resistance, thereby exhibiting excellent heat transfer characteristics.

Next, a heat pipe according to the second embodiment of the present disclosure will be described using FIG. 3. The same components as those of the heat pipe according to the first embodiment will be described using the same reference signs. FIG. 3A is a side sectional view of the heat pipe according to the second embodiment of the present disclosure, and FIG. 3B is the B-B cross-sectional view of FIG. 3A, describing a front cross-section of the heat pipe according to the second embodiment of the present disclosure.

Figures 3A, 3B:
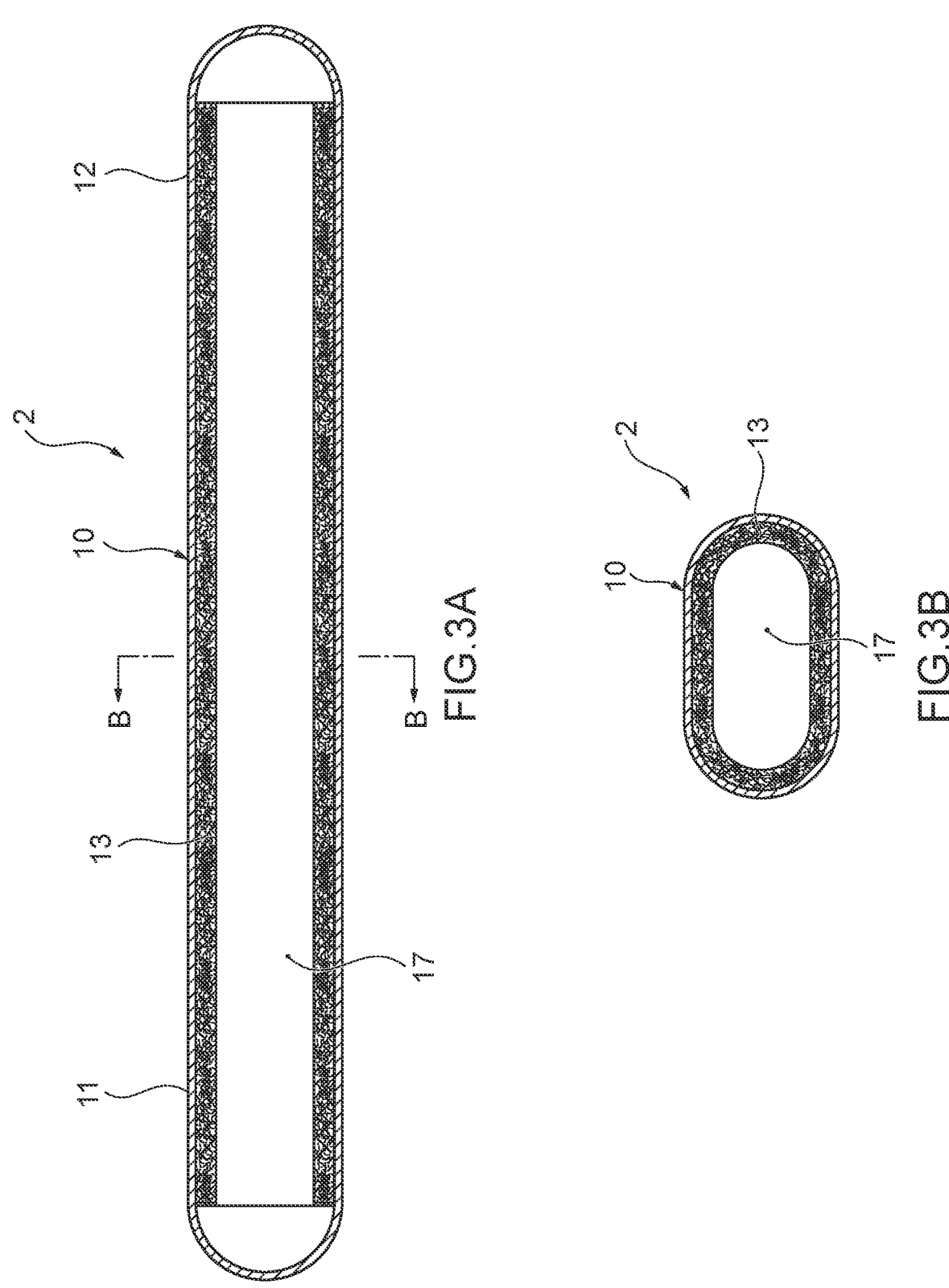
FIG. 3A A side sectional view of a heat pipe according to a second embodiment of the present disclosure.
FIG. 3B A B-B cross-sectional view of FIG. 3A, describing a front cross-section of the heat pipe according to the second embodiment of the present disclosure.

In the heat pipe according to the first embodiment, the cross-sectional shape in a direction orthogonal to the longitudinal direction of the container is substantially circular, but instead in a heat pipe 2 according to the second embodiment, the container is flattened, and has a flat shape as shown in FIGS. 3A and 3B. As the container 10, a bare tube (tube with a smooth inner surface) is used. In the heat pipe 2, similarly to the heat pipe according to the first embodiment, the wick structure 13, which is a sintered body obtained by sintering metal fibers, is disposed on the inner surface of the container 10 from one end portion 11 to another end portion 12 along the longitudinal direction of the container 10.

In the heat pipe 2, by using the bare tube which allows thinning of the thickness of the container 10 compared to a grooved tube in which a plurality of thin grooves extend along the longitudinal direction on the inner surface of the container, it is possible to secure the dimensions of the cavity portion 17 as the vapor flow path. Therefore, in the heat pipe 2, even though the container 10 has a flat shape, a desired maximum heat transfer rate can be obtained. Further, in the heat pipe 2, since the container 10 has a flat shape, the container 10 can be installed even in a narrow space.

Next, a heat pipe according to the third embodiment of the present disclosure will be described using FIG. 4. The same components as those of the heat pipes according to the first and second embodiments will be described using the same reference signs. FIG. 4A is a side sectional view of the heat pipe according to the third embodiment of the present disclosure, and FIG. 4B is the C-C cross-sectional view of FIG. 4A, describing a front cross-section of the heat pipe according to the third embodiment of the present disclosure.

Figures 4A, 4B:
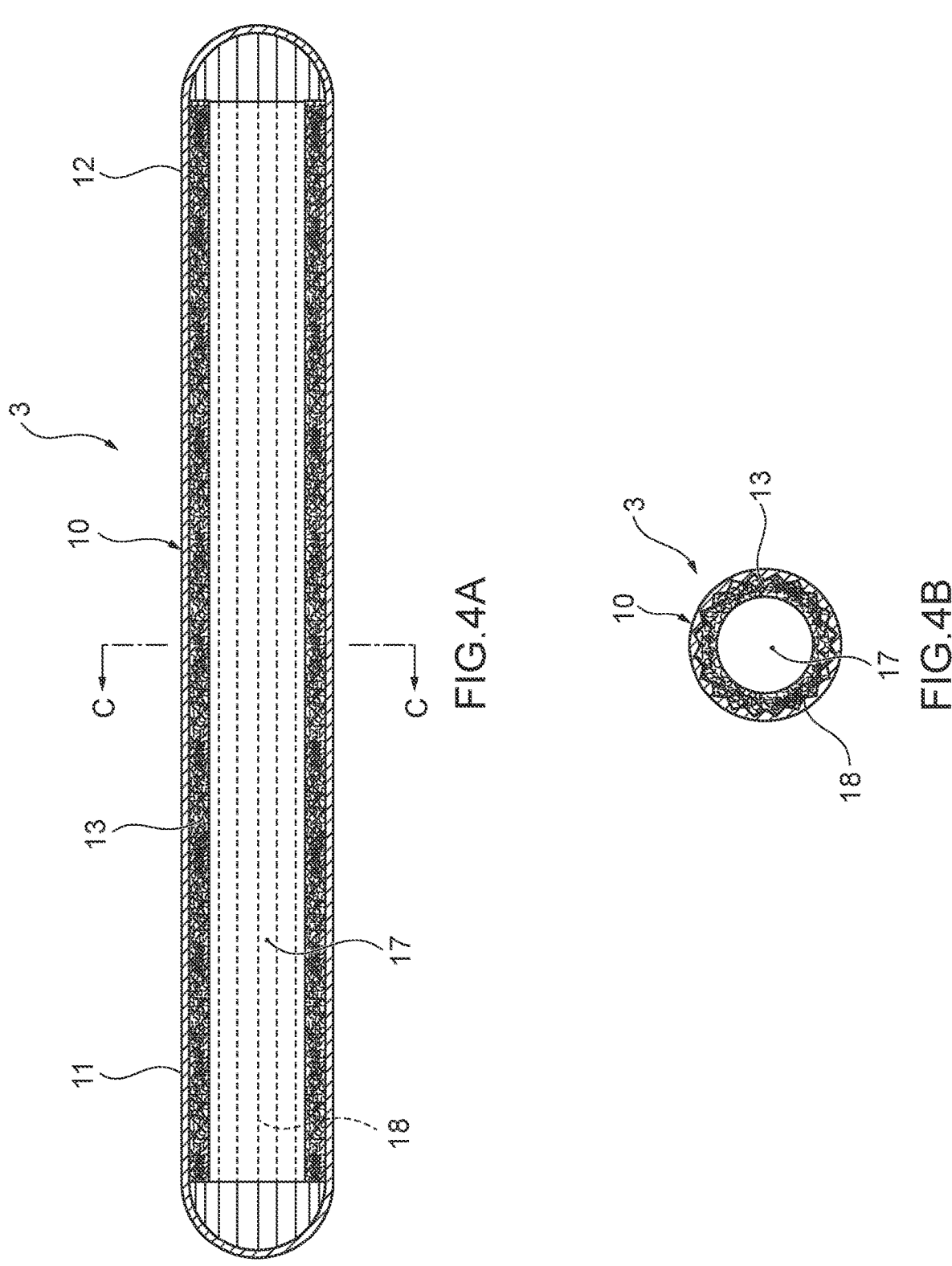
FIG. 4A A side sectional view of a heat pipe according to a third embodiment of the present disclosure.
FIG. 4B A C-C cross-sectional view of FIG. 4A, describing a front cross-section of the heat pipe according to the third embodiment of the present disclosure.

In the heat pipe according to the first embodiment, the container is not particularly limited to a bare tube or a grooved tube, but instead, as shown in FIGS. 4A and 4B, in a heat pipe 3 according to the third embodiment, a grooved tube in which a plurality of thin grooves 18 extend on the inner surface from one end portion 11 to another end portion 12 along the longitudinal direction of the container 10 is used as the container 10. Therefore, in the heat pipe 3, capillary force is provided on the inner surface of the container 10. Moreover, a cross sectional shape in a direction orthogonal to the longitudinal direction of the container 10 is not flattened, and has a substantially circular shape.

In the heat pipe 3, similarly to the heat pipes according to the first and second embodiments, the wick structure 13, which is a sintered body obtained by sintering metal fibers, is disposed on the inner surface of the container 10 from one end portion 11 to another end portion 12 along the longitudinal direction of the container 10. When the heat pipe is installed in the top heat position, the working fluid in the liquid phase may not be refluxed smoothly from the lower side to the upper side in the gravity direction only by the capillary force of the grooved tube. However, in the heat pipe 3, since the wick structure 13 which is a sintered body obtained by sintering metal fibers is disposed from the one end portion 11 to the other end portion 12 of the container 10, the capillary force of the heat pipe 3 is improved. Therefore, even if the heat pipe 3 is installed in the top heat position, the heat pipe 3 exhibits excellent heat transfer characteristics. Also in the heat pipe 3, since the wick structure 13 includes metal fibers having a fiber length of not less than 0.50 mm but not more than 1.8 mm, and a fiber diameter of not less than 10 μm but not more than 50 μm, it is possible to reduce the resistance in the flow path compared with the sintered body obtained by sintering a metal powder, and, even if the heat pipe 3 is installed in the top heat position, it is possible to achieve a good maximum heat transfer rate.

Next, a heat pipe according to the fourth embodiment of the present disclosure will be described using FIG. 5. The same components as those of the heat pipes according to the first to third embodiments will be described using the same reference signs. FIG. 5A is a side sectional view of the heat pipe according to the fourth embodiment of the present disclosure, FIG. 5B is the D-D cross-sectional view of FIG. 5A, describing a front cross-section of the heat pipe according to the fourth embodiment of the present disclosure, and FIG. 5C is the E-E cross-sectional view of FIG. 5A, describing a front cross-section of the heat pipe according to the fourth embodiment of the present disclosure.

Figures 5A, 5B, 5C:
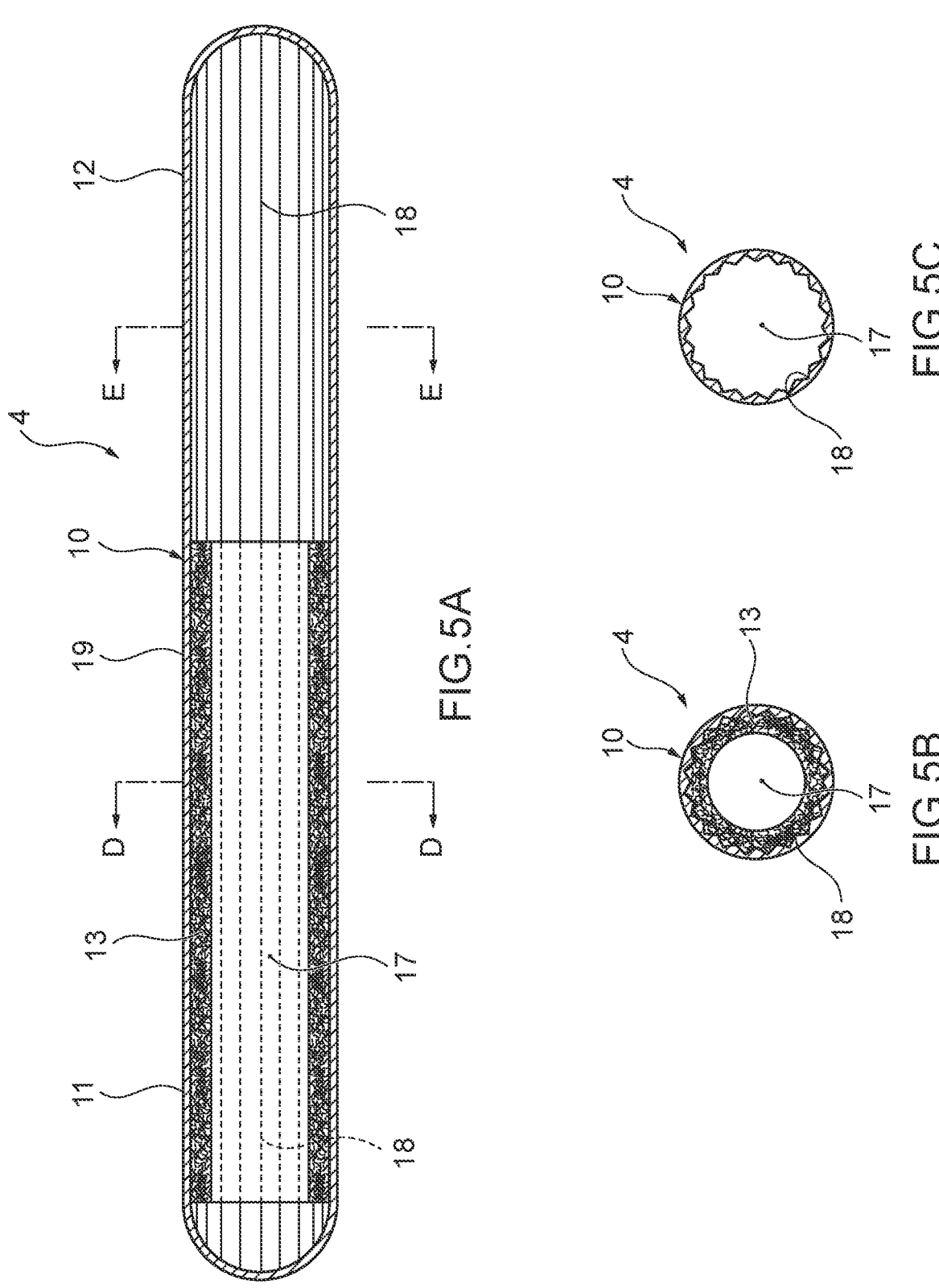
FIG. 5A A side sectional view of a heat pipe according to a fourth embodiment of the present disclosure.
FIG. 5B A D-D cross-sectional view of FIG. 5A, describing a front cross-section of the heat pipe according to the fourth embodiment of the present disclosure.
FIG. 5C An E-E cross-sectional view of FIG. 5A, describing a front cross-section of the heat pipe according to the fourth embodiment of the present disclosure.

In the heat pipes according to the first to third embodiments, the wick structure 13 which is a sintered body obtained by sintering metal fibers is disposed from one end portion 11 to another end portion 12 of the container 10, but instead in a heat pipe 4 according to the fourth embodiment, as shown in FIGS. 5A, 5B and 5C, the wick structure 13 which is a sintered body layer of metal fibers is disposed in a part in the longitudinal direction of the container 10. Further, in the heat pipe 4, a grooved tube in which a plurality of thin grooves 18 are formed is used as the container 10. Therefore, in a portion which is not covered with the wick structure 13, the thin grooves 18 formed on the inner surface of the container 10 are exposed.

A portion in which the wick structure 13 is disposed in the longitudinal direction of the container 10 and a portion in which the wick structure 13 is not provided are not particularly limited, and may be selected according to the conditions of use of the heat pipe 4. In the heat pipe 4, the wick structure 13 is disposed in the longitudinal direction of the container 10 from one end portion 11 to an intermediate portion 19 located in the middle between the one end portion 11 and another end portion 12, and the wick structure is not disposed in the other end portion 12.

The wick structure 13 is formed on the entire inner peripheral surface in the radial direction of the container 10. Therefore, the inner peripheral surface that forms the longitudinal direction of the container 10 is covered with the wick structure 13 in the form of a layer from the one end portion 11 to the intermediate portion 19. That is, on the inner peripheral surface in the longitudinal direction of the container 10, the surface of the wick structure 13 serves as a wall surface of the vapor flow path from the one end portion to the intermediate portion 19, while the inner surface of the container 10 serves as a wall surface of the vapor flow path in the other end portion 12.

In the heat pipe 4, since a grooved tube is used, the wick structure 13 covers over a plurality of thin grooves 18 from the one end portion 11 to the intermediate portion 19. Moreover, in the heat pipe 4, a cross sectional shape in a direction orthogonal to the longitudinal direction of the container 10 is not flattened, and has a substantially circular shape.

In the heat pipe 4, for example, when the one end portion 11 functions as a heat receiving portion, the other end portion 12 functions as a heat radiating portion, and the intermediate portion 19 functions as a heat insulating portion, the thin grooves 18 in the other end portion 12 contributes to a phase change of the working fluid in the gas phase to the liquid phase, and the working fluid which has undergone the phase change from the gas phase to the liquid phase in the other end portion 12 is refluxed from the heat radiating portion (another end portion 12) to the heat receiving portion (one end portion 11) by the capillary force of the thin grooves 18 and the capillary force of the wick structure 13. In the heat pipe 4, the wick structure 13 which is a sintered body obtained by sintering metal fibers is disposed from the one end portion 11 to the intermediate portion 19 of the container 10 and the thin grooves 18 having the capillary force on the inner surface thereof are exposed in the other end portion 12, and therefore the capillary force exists over the entire longitudinal direction of the container 10. Thus, the heat pipe 4 exhibits excellent heat transfer characteristics.

Further, in the heat pipe 4, in the intermediate portion 19, the working fluid in the gas phase and the working fluid in the liquid phase are convection currents. However, the wick structure 13 can prevent the working fluid in the liquid phase from scattering from the thin grooves 18 by a flow of the working fluid in the gas phase. Therefore, in the heat pipe 4, the reflux characteristic of the working fluid in the liquid phase is improved, and consequently the maximum heat transfer rate is improved.

Figures 6A, 6B, 6C, 6D:
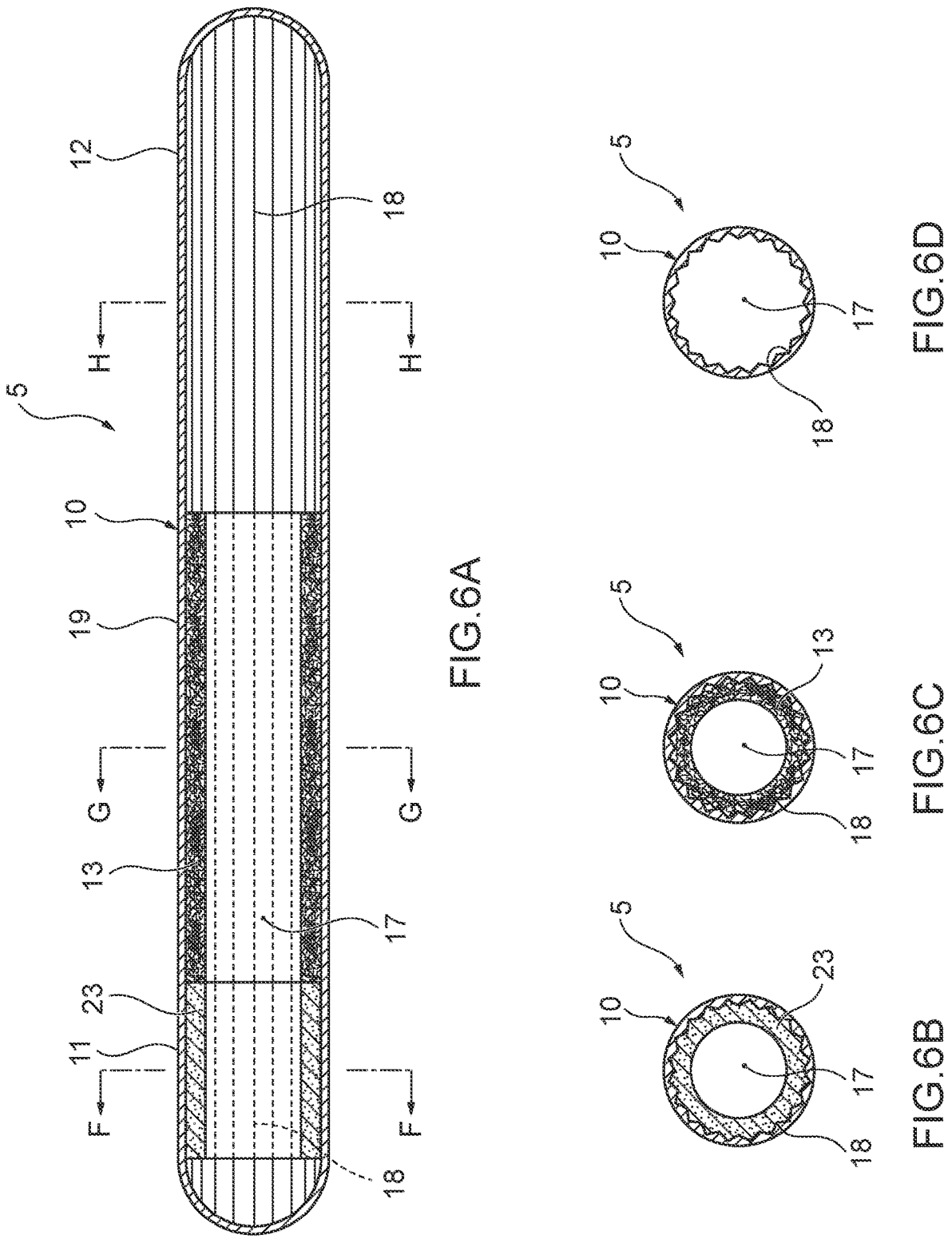
FIG. 6A A side sectional view of a heat pipe according to a fifth embodiment of the present disclosure.
FIG. 6B An F-F cross-sectional view of FIG. 6A, describing a front cross-section of the heat pipe according to the fifth embodiment of the present disclosure.
FIG. 6C A G-G cross-sectional view of FIG. 6A, describing a front cross-section of the heat pipe according to the fifth embodiment of the present disclosure.
FIG. 6D An H-H cross-sectional view of FIG. 6A, describing a front cross-section of the heat pipe according to the fifth embodiment of the present disclosure.

Next, a heat pipe according to the fifth embodiment of the present disclosure will be described using FIG. 6. The same components as those of the heat pipes according to the first to fourth embodiments will be described using the same reference signs. FIG. 6A is a side sectional view of the heat pipe according to the fifth embodiment of the present disclosure, FIG. 6B is the F-F cross-sectional view of FIG. 6A, describing a front cross-section of the heat pipe according to the fifth embodiment of the present disclosure, FIG. 6C is the G-G cross-sectional view of FIG. 6A, describing a front cross-section of the heat pipe according to the fifth embodiment of the present disclosure, and FIG. 6D is the H-H cross-sectional view of FIG. 6A, describing a front cross-section of the heat pipe according to the fifth embodiment of the present disclosure.

In the heat pipes according to the first to fourth embodiments, the wick structure 13 which is a sintered body obtained by sintering metal fibers is disposed, but instead in a heat pipe 5 according to the fifth embodiment, as shown in FIGS. 6A, 6B, 6C and 6D, the wick structure 13, which is a sintered body of metal fibers, and another wick structure 23, which is a sintered body obtained by sintering a metal powder particles, are disposed.

The heat pipe 5 includes the wick structure 13 disposed in a part in the longitudinal direction of the container 10, and the other wick structure 23 which is obtained by sintering the metal powder and disposed in another part in the longitudinal direction of the container 10. A portion in the longitudinal direction of the container 10 where the wick structure 13 is disposed and a portion where the other wick structure 23 is disposed are not particularly limited, and may be selected according to the conditions of use of the heat pipe. In the heat pipe 5, the other wick structure 23 is disposed in one end portion 11 in the longitudinal direction of the container 10, and the wick structure 13 is disposed in the intermediate portion 19. The wick structure 13 and the other wick structure 23 are connected in the longitudinal direction of the container 10.

Neither of the wick structure 13 and the other wick structure 23 is disposed in the other end portion 12. Therefore, in the other end portion 12 which is not covered with neither the wick structure 13 nor the other wick structure 23, the inner surface of the container 10 is exposed.

Both of the wick structure 13 and the other wick structure 23 are formed on the entire inner peripheral surface in the radial direction of the container 10. Thus, the inner peripheral surface that forms the longitudinal direction of the container 10 is covered with the other wick structure 23 in the form of a layer in the one end portion 11, and is covered with the wick structure 13 in the form of a layer in the intermediate portion 19. That is, on the inner peripheral surface in the longitudinal direction of the container 10, the surface of the other wick structure 23 serves as a wall surface of the vapor flow path in the one end portion 11, and the surface of the wick structure 13 serves as a wall surface of the vapor flow path in the intermediate portion 19. Moreover, in the other end portion 12, the inner surface of the container 10 serves as a wall surface of the vapor flow path. Further, as shown in FIG. 6B, the thicknesses of the other wick structure 23 in a cross section in a direction orthogonal to the longitudinal direction of the container 10 is substantially uniform, and the shape of the vapor flow path in the cross section in the direction orthogonal to the longitudinal direction of the container 10 is circular.

The metal species of metal powder which is a raw material of the other wick structure 23 is not particularly limited, and examples include copper and copper alloys. Further, the average primary particle diameter of the metal powder is not particularly limited, and can be, for example, 10 $\mu$m to 300 $\mu$m.

In the heat pipe 5, a grooved tube in which a plurality of thin grooves 18 are formed is used as the container 10. Thus, the other wick structure 23 covers over the plurality of thin grooves 18 in the one end portion 11, and the wick structure 13 covers over the plurality of thin grooves 18 in the intermediate portion 19. Moreover, in the heat pipe 5, a cross sectional shape in a direction orthogonal to the longitudinal direction of the container 10 is not flattened, and has a substantially circular shape.

In the heat pipe 5, for example, when the one end portion 11 functions as a heat receiving portion, the other end portion 12 functions as a heat radiating portion, and the intermediate portion 19 functions as a heat insulating portion, the thin grooves 18 in the other end portion 12 contribute to a phase change of the working fluid in the gas phase to the liquid phase, and the working fluid which has undergone the phase change from the gas phase to the liquid phase in the other end portion 12 is refluxed from the heat radiating portion (another end portion 12) to the heat receiving portion (one end portion 11) by the capillary force of the thin grooves 18, the capillary force of the wick structure 13, and the capillary force of the other wick structure 23. In the heat pipe 5, the other wick structure 23 which is a sintered body obtained by sintering a metal powder is disposed in the one end portion 11 of the container 10, the wick structure 13 which is a sintered body obtained by sintering metal fibers and connected to the other wick structure 23 is disposed in the intermediate portion 19, and the thin grooves 18 having the capillary force on the inner surface are exposed in the other end portion 12, and thus the capillary force exists over the entire longitudinal direction of the container 10. As shown in FIG. 6A, in the other wick structure 23, the average thickness in a direction orthogonal to the longitudinal direction of the container 10 is substantially uniform from the heat insulating portion side to the heat receiving portion side.

Moreover, the other wick structure 23 which is a sintered body obtained by sintering metal powder particles has excellent holding power for the working fluid in the liquid phase, and therefore, even if the heat pipe 5 is installed in the top heat position, it is possible to more reliably prevent dry-out.

Figure 7:
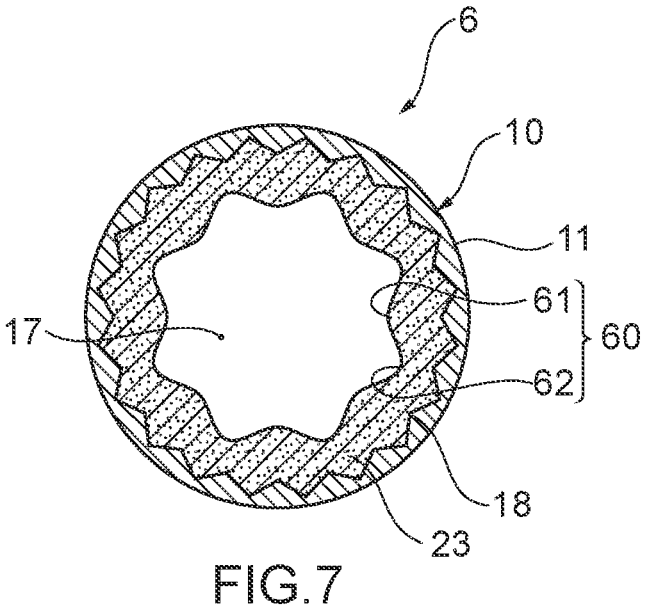
FIG. 7 A front sectional view of a heat pipe according to a sixth embodiment of the present disclosure.

Next, a heat pipe according to the sixth embodiment of the present disclosure will be described using FIG. 7. The same components as those of the heat pipes according to the first to fifth embodiments will be described using the same reference signs. FIG. 7 is a front sectional view of the heat pipe in the region of another wick structure according to the sixth embodiment of the present disclosure.

In the heat pipe according to the fifth embodiment, the shape of the vapor flow path in a cross section in a direction orthogonal to the longitudinal direction of the container 10 is circular, but instead in the heat pipe 6 according to the sixth embodiment, the surface of another wick structure 23 that forms a wall surface of the vapor flow path as the cavity portion 17 has recessed and protruding portions 60. That is, the cross sectional shape of the other wick structure 23 in a direction orthogonal to the longitudinal direction of the container 10 has the recessed and protruding portions 60. The thickness of the other wick structure 23 in the recessed and protruding portions 60 is thicker in a protruding portion 61 than in a recessed portion 62. Therefore, in the heat pipe 6, the area of the surface of the other wick structure 23 is larger than the area of the surface of the other wick structure of the heat pipe according to the fifth embodiment.

The recessed and protruding portions 60 may be formed on the entire inner peripheral surface in the radial direction of the container 10, or may be formed on a part of the inner peripheral surface in the radial direction of the container 10. In the heat pipe 6, the recessed and protruding portions 60 are formed on the entire inner peripheral surface in the radial direction of the container 10. Moreover, in the other wick structure 23 in the longitudinal direction of the container 10, the recessed and protruding portions 60 may be formed over the entire longitudinal direction, or in a part of the longitudinal direction.

The shape of the recessed and protruding portions 60 in a cross section in a direction orthogonal to the longitudinal direction of the container 10 is not particularly limited, but, in the heat pipe 6, the protruding portion 61 has an arc shape, and the recessed portion 62 also has an arc shape. Thus, in the heat pipe 6, the protruding portions 61 protruding in an arc shape and the recessed portions 62 recessed in an arc shape are formed on the wall surface of the vapor flow path along the inner peripheral surface of the container 10. Accordingly, the shape of the vapor flow path in the cross section in the direction orthogonal to the longitudinal direction of the container 10 is a flower petal shape in the region of the other wick structure 23.

In the heat pipe 6, similarly to the heat pipe according to the fifth embodiment, when the one end portion 11 functions as the heat receiving portion, the other end portion functions as the heat radiating portion, and the intermediate portion functions as the heat insulating portion, the thin grooves 18 in the other end portion contribute to a phase change of the working fluid in the gas phase to the liquid phase, and the working fluid which has undergone a phase change from the gas phase to the liquid phase in the other end portion is refluxed from the heat radiating portion (another end portion) to the heat receiving portion (one end portion 11) by the capillary force of the thin grooves 18, the capillary force of the wick structure as a sintered body obtained by sintering metal fibers, and the capillary force of the other wick structure 23. Also in the heat pipe 6, similarly to the heat pipe according to the fifth embodiment, the other wick structure 23 which is a sintered body obtained by sintering a metal powder is disposed in the one end portion 11 of the container 10, the wick structure 13 which is a sintered body obtained by sintering metal fibers and connected to the other wick structure 23 is disposed in the intermediate portion 19, and the thin grooves 18 having the capillary force on the inner surface are exposed in the other end portion, and thus the heat pipe 6 has the capillary force over the entire longitudinal direction of the container 10.

Moreover, in the heat pipe 6, among the recessed and protruding portions 60 of the other wick structure 23, in the recessed portions 62 where the thickness of the other wick structure 23 is thinner than in the protruding portions 61, a phase change of the working fluid in the liquid phase to the gas phase is promoted. Further, since the other wick structure 23 has the recessed and protruding portions 60, the area of the surface of the other wick structure 23 is larger, that is, the evaporation area for the working fluid in the liquid phase is larger, and a phase change of the working fluid in the liquid phase to the gas phase is promoted. Furthermore, in the protruding portions 61 where the thickness of the other wick structure 23 is thicker than in the recessed portions 62, excellent reflux characteristics are exhibited with respect to the working fluid in the liquid phase. Thus, since the heat pipe 6 has a good maximum heat transfer rate and can reduce the thermal resistance, it is possible to exhibit excellent heat transfer characteristics.

Figure 8:
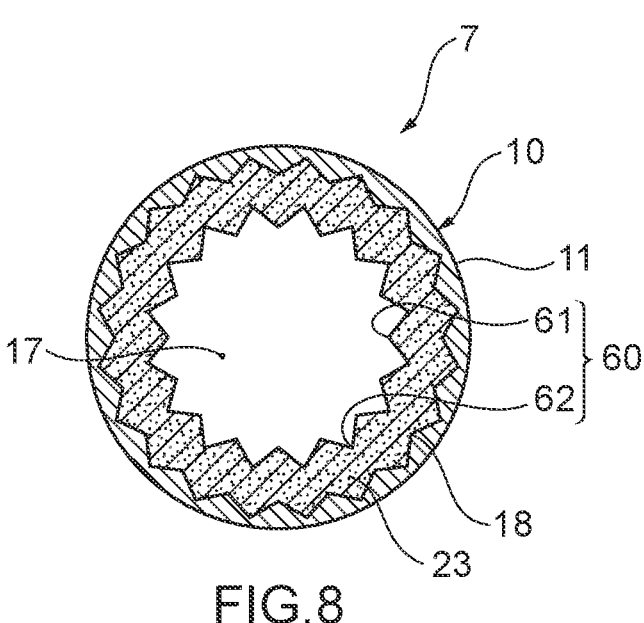
FIG. 8 A front sectional view of a heat pipe according to a seventh embodiment of the present disclosure.

Next, a heat pipe according to the seventh embodiment of the present disclosure will be described using FIG. 8. The same components as those of the heat pipes according to the first to sixth embodiments will be described using the same reference signs. FIG. 8 is a front sectional view of the heat pipe in the region of another wick structure according to the seventh embodiment of the present disclosure.

In the heat pipe according to the sixth embodiment, the protruding portion of the other wick structure has an arc shape, and the recessed portion also has an arc shape, and the shape of the vapor flow path in a cross section in a direction orthogonal to the longitudinal direction of the container in the region of the other wick structure has a flower petal shape, whereas in a heat pipe 7 according to the seventh embodiment, as shown in FIG. 8, the shape of the vapor flow path (the cavity portion 17) in a cross section in a direction orthogonal to the longitudinal direction of the container 10 in the region of the other wick structure 23 is a star shape. In the heat pipe 7, in the cross section in the direction orthogonal to the longitudinal direction of the container 10, the protruding portion 61 of the recessed and protruding portions 60 has a V shape, and the recessed portion 62 also has a V shape.

Also in the heat pipe 6, similarly to the heat pipe according to the sixth embodiment, among the recessed and protruding portions 60 of the other wick structure 23, in the recessed portions 62 where the thickness of the other wick structure 23 is thinner than in the protruding portions 61, a phase change of the working fluid in the liquid phase to the gas phase is promoted. Further, since the other wick structure 23 has the recessed and protruding portions 60, the area of the surface of the other wick structure 23 is larger, and a phase change of the working fluid in the liquid phase to the gas phase is promoted. Furthermore, in the protruding portions 61 where the thickness of the other wick structure 23 is thicker than in the recessed portions 62, excellent reflux characteristics are exhibited with respect to the working fluid in the liquid phase. Thus, similarly to the heat pipe according to the sixth embodiment, since the heat pipe 7 also has a good maximum heat transfer rate and can reduce the thermal resistance, it is possible to exhibit excellent heat transfer characteristics.

Next, an example of a manufacturing method of a heat pipe of the present disclosure will be described. Here, an example of the manufacturing method of a heat pipe according to the first embodiment will be described. The manufacturing method is not particularly limited, and, for example, a core rod of a predetermined shape (for example, a core rod made of stainless steel) is inserted from one end portion in the longitudinal direction of a tubular material having a substantially circular cross section in the radial direction. A cavity portion formed between the inner surface of the tube material and the outer surface of the core rod is filled with metal fibers as a raw material of a wick structure. Next, the wick structure is produced by heating the tubular material filled with the metal fibers under a reducing atmosphere to sinter the metal fibers, and the core rod is removed from the tubular material. Next, one end portion of the container (tubular material) is sealed while leaving one sealing opening, and after a working fluid is injected from the sealing opening, the inside of the container is brought into a pressure-reduced state by performing a deaeration process such as heating deaeration or vacuum deaeration. Thereafter, by sealing the sealing opening, it is possible to manufacture the heat pipe.

Further, the inner surface of the tubular material may be subjected to a cleaning process, if necessary, before filling the metal fibers. By cleaning the inner surface of the tube material, it is possible to prevent deterioration of the heat transfer characteristics due to contamination and the like. Examples of a cleaning method include solvent degreasing, electrolytic degreasing, etching, and oxidation treatment. A sealing method is not particularly limited, and examples include TIG welding, resistance welding, pressure welding, and soldering.

Next, a heat pipe according to another embodiment of the present disclosure will be described. In the above embodiment, although the container of the heat pipe has a tubular shape, the shape of the container is not particularly limited, but the container may have, for example, a planar shape instead, that is, the heat pipe may be of a planar type. In this case, the container can be formed by placing a pair of plate members one over another.

In the first embodiment, the entire inner peripheral surface that forms the longitudinal direction of the container is covered with the wick structure, but instead a part of the inner peripheral surface that forms the longitudinal direction of the container may be covered with the wick structure, and the inner surface of the container may be exposed in other part.

In the heat pipe according to the sixth embodiment, the shape of the vapor flow path in a cross section in a direction orthogonal to the longitudinal direction of the container in the region of the other wick structure is a flower petal shape, whereas in the seventh embodiment, the shape of the vapor flow path in the cross section in the direction orthogonal to the longitudinal direction of the container in the region of the other wick structure is a star shape. However, the shape of the vapor flow path is not particularly limited, and, instead of the above shape, for example, the cross section in the direction orthogonal to the longitudinal direction of the container may be a gear shape in which both the recessed portions and the protruding portions of the recessed and protruding portions of the other wick structure are trapezoidal. Further, the shape of the vapor flow path in the cross section in the direction orthogonal to the longitudinal direction of the container may be polygonal, such as triangular, square, and pentagonal.

In the fifth to seventh embodiments, the average thickness of the other wick structure in a direction orthogonal to the longitudinal direction of the container is substantially uniform from the heat insulating portion (intermediate portion) side to the heat receiving portion (one end portion) side, but instead, the average thickness of the other wick structure in the direction orthogonal to the longitudinal direction of the container may decrease from the heat insulating portion (intermediate portion) toward the heat receiving portion (one end portion). That is, the average thickness of the other wick structure in the direction orthogonal to the longitudinal direction of the container may decrease from one connected end of the other wick structure, which is the end portion connected to the wick structure, toward another end of the other wick structure opposite the one connected end.

In the first to third embodiments, the wick structure, which is a sintered body of metal fibers, extends from one end portion to another end portion of the container, but instead, a part of the wick structure as the sintered body of metal fibers may be another wick structure which is a sintered body of metal powder particles. In this case, the wick structure is connected to the other wick structure, and a wick part composed of the wick structure and the other wick structure extends from the one end portion to another end portion of the container.

Moreover, in the above aspect in which the wick part composed of the wick structure and the other wick structure extends from the one end portion to another end portion of the container, the thickness of the other wick structure in a cross section in a direction orthogonal to the longitudinal direction of the container is substantially uniform, and the shape of the vapor flow path in the cross section in the direction orthogonal to the longitudinal direction of the container may be circular. Further, the shape of the other wick structure in the cross section in the direction orthogonal to the longitudinal direction of the container may have recessed and protruding portions. In this case, the thickness of the other wick structure in the cross section in the direction orthogonal to the longitudinal direction of the container is thicker in the protruding portions than in the recessed portions, and the surface of the other wick structure that forms a wall surface of the vapor flow path has recessed and protruding portions. The area of the surface of the other wick structure having the recessed and protruding portions is larger than the area of the surface of the other wick structure having a substantially uniform average thickness.

Even in the aspect in which the wick part extends from one end portion to another end portion of the container, the recessed and protruding portions may be formed on the entire inner peripheral surface in the radial direction of the container, or may be formed on a part of the inner peripheral surface in the radial direction of the container. Moreover, in the longitudinal direction of the container of the other wick structure, the recessed and protruding portions may be formed over the entire longitudinal direction, or in a part of the longitudinal direction.

Even in the aspect in which the wick part extends from the one end portion to another end portion of the container, the shape of the vapor flow path in the cross section in the direction orthogonal to the longitudinal direction of the container in the region of the other wick structure is not particularly limited, but may be, for example, a shape having recessed and protruding portions, such as a flower petal shape, a star shape, and a gear shape. Further, the shape of the vapor flow path in the cross section in the direction orthogonal to the longitudinal direction of the container in the region of the other wick structure may be polygonal, such as triangular, square, and pentagonal.

The other wick structure may be disposed, for example, in a region functioning as the heat receiving portion. In this aspect, even if the heat pipe is installed in the top heat position, the wick part provides good capillary force and has an excellent maximum heat transfer rate.

Also, in the aspect in which the wick part extends from the one end portion to another end portion of the container, among the recessed and protruding portions of the other wick structure, in the recessed portions where the thickness of the other wick structure is thinner than in the protruding portions, a phase change of the working fluid in the liquid phase to the gas phase is promoted. Moreover, since the other wick structure has the recessed and protruding portions, the area of the surface of the other wick structure is larger, and the phase change of the working fluid in the liquid phase to the gas phase is promoted. Furthermore, in the protruding portions where the thickness of the other wick structure is thicker than in the recessed portions, excellent reflux characteristics are exhibited with respect to the working fluid in the liquid phase. Thus, even the heat pipe with the wick part extending from the one end portion to another end portion of the container has a good maximum heat transfer rate and can reduce the thermal resistance, and therefore it is possible to exhibit excellent heat transfer characteristics.

In addition, even when the shape of the vapor flow path is polygonal, such as triangular, square and pentagonal, since a portion where the thickness of the other wick structure is thicker and a portion where the thickness is thinner are formed, the area of the surface of the other wick structure is larger, and a phase change of the working fluid in the liquid phase to the gas phase is promoted. Moreover, in the portion where the thickness of the other wick structure is thicker, excellent reflux characteristics are exhibited with respect to the working fluid in the liquid phase.

Further, in the aspect in which the wick part extends from one end portion to another end portion of the container, the average thickness of the other wick structure in a cross section in a direction orthogonal to the longitudinal direction of the container may be substantially uniform from the other end portion side to the one end portion side. Also, the average thickness in the direction orthogonal to the longitudinal direction of the container may decrease from the other end portion toward the one end portion. That is, the average thickness of the other wick structure in the direction orthogonal to the longitudinal direction of the container may decrease from one connected end of the other wick structure, which is the end portion connected to the wick structure, toward another end of the other wick structure opposite the one connected end.

EXAMPLES

Next, examples of the present disclosure will be described, but the present disclosure is not limited to these examples unless departing from the gist of the present disclosure.

Heat Pipe of Examples

As a heat pipe, a heat pipe according to the first embodiment of the present disclosure shown in FIGS. 1 and 2 was used. The cross section in a radial direction of the heat pipe was circular, the length of the heat pipe was 300 mm, the diameter was 10 mm, and the average thickness of the wick structure was 1.7 mm. The wick structure was disposed on the entire inner peripheral surface that forms the longitudinal direction of the container made of copper. The metal fibers constituting the wick structure are copper fibers of two types: 0.9 mm in fiber length×30 μm in fiber diameter, and 1.4 mm in fiber length×30 μm in fiber diameter.

Heat Pipe of Comparative Examples

The same as the examples except that the dimensions of the metal fibers were 0.4 mm in fiber length×30 μm in fiber diameter, 1.9 mm in fiber length×30 μm in fiber diameter, and 2.9 mm in fiber length×30 μm in fiber diameter.

Heat Pipe of Reference Example

Instead of the metal fibers, copper powder having an average particle diameter of 0.1 mm was sintered to produce a wick structure made of a sintered body of copper powder.

A heat generating device (heat value of 30 W to 150 W) was attached to one end portion of the heat pipe to make an evaporating portion, heat exchange means was attached to another end portion to make a condensing portion, a heat insulating material was attached between the evaporating portion and the condensing portion to make a heat insulating portion, and the heat pipe was installed to be inclined at 22 degrees with respect to the horizontal direction so that the evaporating portion side is positioned higher than the condensing portion side. Under the conditions of use, the maximum heat transfer rate (Q max) and thermal resistance were measured as follows.

Porosity (%)

The mass of metal fibers to be stored in a copper tube as a container was measured, the volume of the sintered body of the metal fibers was calculated from the sizes of the copper tube and the core rod, the filling rate was calculated using the mass of the metal fibers and the volume of the sintered body of the metal fibers, and the porosity was calculated by (100−filling rate).

(1) Maximum Heat Transfer Rate (Q max) (W)

Heat input was increased by 10 W at a time from 30 W, and the quantity of the heat input immediately before the temperature of the evaporating portion became unsteady was taken as the maximum heat transfer rate.

Evaluation

A better maximum heat transfer rate was obtained relative to the heat pipe of the reference example: ○

The maximum heat transfer rate was decreased relative to the heat pipe of the reference example: x (2) Thermal Resistance (° C./W)

When the heat input was the maximum heat transfer rate, a value obtained by dividing the difference between the temperature of the evaporating portion and the temperature of the heat insulating portion by the heat input was taken as the thermal resistance of the evaporating portion, a value obtained by dividing the difference between the temperature of the condensing portion and the temperature of the heat insulating portion by the heat input was taken as the thermal resistance of the condensing portion, and a value obtained by dividing the difference between the temperature of the evaporating portion and the temperature of the condensing portion by the heat input was taken as the overall thermal resistance of the heat pipe.

Evaluation

The overall thermal resistance of the heat pipe was decreased relative to the heat pipe of the reference example: ○

Figure 9:
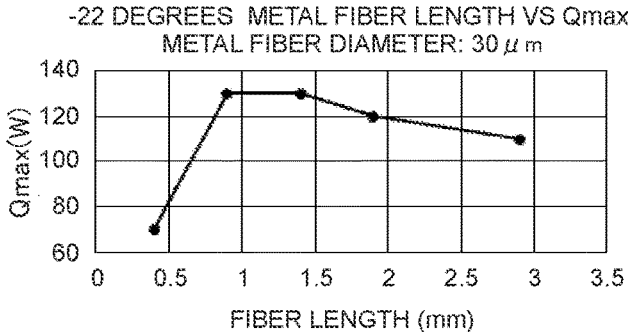
FIG. 9 A table showing measurement results of examples of the present disclosure and comparative examples.
Figure 9:
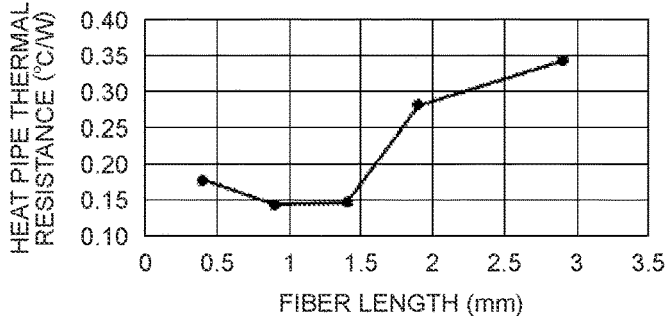
Figure 9:
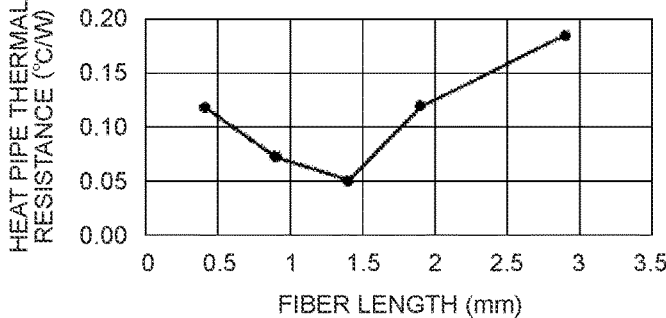
Figure 9:
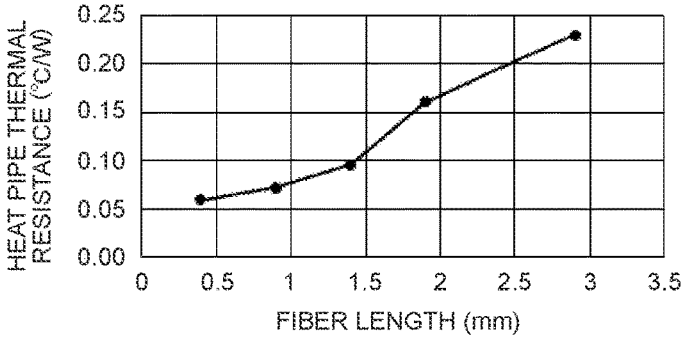

The overall thermal resistance of the heat pipe was increased relative to the heat pipe of the reference example: x The actual measurement values of the measurement results are shown in Table 1 below, the evaluation results based on the actual measurement values in Table 1 are shown in Table 2 below, and the graphs of the actual measurement values of the measurement results are shown in FIG. 9.

TABLE 1

| | Metal fiber diameter (µm) | Metal fiber length (mm) | Porosity (%) | Qmax (W) | Overall thermal resistance of heat pipe (° C./W) | Thermal resistance of condensing portion (° C./W) | Thermal resistance of evaporating portion (° C./W) |
|---|---|---|---|---|---|---|---|
| Comparative Example 1 | 30 | 0.4 | 68.0 | 70 | 0.18 | 0.06 | 0.12 |
| Example 1 | 30 | 0.9 | 78.2 | 130 | 0.14 | 0.07 | 0.07 |
| Example 2 | 30 | 1.4 | 84.2 | 130 | 0.15 | 0.10 | 0.05 |
| Comparative Example 2 | 30 | 1.9 | 87.9 | 120 | 0.28 | 0.16 | 0.12 |
| Comparative Example 3 | 30 | 2.9 | 90.9 | 110 | 0.34 | 0.23 | 0.19 |
| Reference Example | — | | | 70 | 0.19 | 0.04 | 0.15 |

TABLE 2

| | Metal fiber diameter (µm) | Metal fiber length (mm) | Qmax (W) | Overall thermal resistance of heat pipe (° C./W) |
|---|---|---|---|---|
| Comparative Example 1 | 30 | 0.4 | x | ○ |
| Example 1 | 30 | 0.9 | ○ | ○ |
| Example 2 | 30 | 1.4 | ○ | ○ |
| Comparative Example 2 | 30 | 1.9 | ○ | x |
| Comparative Example 3 | 30 | 2.9 | ○ | x |

From the results in Tables 1 and 2 and FIG. 9, in Example 1 with 30 µm in metal fiber diameter×0.9 mm in metal fiber length and in Example 2 with 30 µm in metal fiber diameter× 1.4 mm in metal fiber length, since the heat pipes had excellent maximum heat transfer rates and reduced the thermal resistance, it was found that the heat pipes were capable of exhibiting excellent heat transfer characteristics. On the other hand, in Comparative Example 1 with 30 µm in metal fiber diameter×0.4 mm in metal fiber length, the maximum heat transfer rate was decreased, and in Comparative Example 2 with 30 µm in metal fiber diameter×1.9 mm in metal fiber length and in Comparative Example 3 with 30 µm in metal fiber diameter×2.9 mm in metal fiber length, the thermal resistance was not reduced.

Even if a heat pipe of the present disclosure is installed in the top heat position, the heat pipe has a good maximum heat transfer rate and can reduce thermal resistance and consequently exhibit excellent heat transfer characteristics, and therefore the heat pipe can be used in the field of electronic parts, such as semiconductor devices mounted in electric and electronic equipment.

What is claimed is:

1. A heat pipe comprising:

a container having a sealed internal space;

a wick structure having a sintered body with metal fibers, and disposed on an inner surface of the container and disposed in a part in a longitudinal direction of the container;

an another wick structure having a sintered body with metal powder disposed in another part in the longitudinal direction of the container; and a working fluid sealed in the internal space of the container, wherein the metal fibers include metal fibers having a fiber length of not less than 0.50 mm but not more than 1.8 mm and a fiber diameter of not less than 10 µm but not more than 50 µm, the wick structure is butted and connected to the another wick structure with no overlap in the longitudinal direction of the container, the container is a grooved tube, and includes the another wick structure in one end portion of the container that functions as a heat receiving portion, the wick structure includes a heat insulating portion which is an intermediate portion between the heat receiving portion and other end portion of the container that functions as a heat radiating portion, the heat pipe further comprises narrow grooves on the inner surface of the container exposed in the other end portion of the container, at least the another wick structure fills an inside of the narrow grooves, in the other end portion which is not covered with neither the wick structure nor the another wick structure, the inner surface of the container where the narrow grooves are formed is exposed, and the intermediate portion is covered with the wick structure, a shape of a vapor flow path in a cross section in a direction orthogonal to the longitudinal direction of the container in a region of the another wick structure has, at least in part, a flow petal shape, a star shape, a polygonal shape or a gear shape, the another wick structure has recessed portions and protruding portions, a shape of the recessed portions in the vapor flow path in a cross section in a direction orthogonal to the longitudinal direction of the container has an arc shape, a V shape or a trapezoidal shape, a thickness of the another wick structure is thicker in the protruding portions than in the recessed portions, a depth of the recessed portions is deeper than a depth of a valley of the narrow grooves of the grooved tube, and a width of the narrow groove widens toward the center of the heat pipe from the bottom of the groove so that the evaporation area for the working fluid in the liquid phase is larger, and a phase change of the working fluid in the liquid phase to the gas phase is promoted, and a width of the recessed portions of the another wick structure widens toward the center of the heat pipe.

2. The heat pipe according to claim 1, wherein the metal fibers have an average fiber length of not less than 0.50 mm but not more than 1.8 mm, and an average fiber diameter of not less than 10 µm but not more than 50 µm.

3. The heat pipe according to claim 1, wherein the wick structure has a porosity of not less than 70% but not more than 86%.

4. The heat pipe according to claim 1, wherein the metal fibers are at least one metal species selected from the group consisting of copper, copper alloys, aluminum, aluminum alloys, titanium, titanium alloys and stainless steel.

5. The heat pipe according to claim 1, wherein the container has a tubular shape or a planar shape.

6. The heat pipe according to claim 1, wherein the container is made of metal, and a metal species of the container is same as a metal species of the metal fibers.

7. The heat pipe according to claim 1, wherein neither the wick structure nor the another wick structure is provided at a tip of the container.

8. The heat pipe according to claim 1, wherein the heat pipe is installed in the top heat position.

9. The heat pipe according to claim 1, wherein a capillary force exists over the entire longitudinal direction of the container, in the intermediate portion, the working fluid in a gas phase and the working fluid in a liquid phase are convection currents, the wick structure prevents the convection currents of the working fluid in the liquid phase from scattering from the narrow grooves by the flow of the working fluid in the gas phase.

10. A heat pipe comprising:

a container having a sealed internal space;

a wick structure having a sintered body with metal fibers, and disposed on an inner surface of the container and disposed in a part in a longitudinal direction of the container;

an another wick structure having a sintered body with metal powder disposed in another part in the longitudinal direction of the container; and a working fluid sealed in the internal space of the container, wherein the metal fibers include metal fibers having a fiber length of not less than 0.50 mm but not more than 1.8 mm and a fiber diameter of not less than 10 μm but not more than 50 μm, the wick structure is butted and connected to the another wick structure with no overlap in the longitudinal direction of the container, the container is a grooved tube, and includes the another wick structure in one end portion of the container that functions as a heat receiving portion, the wick structure includes a heat insulating portion which is an intermediate portion between the heat receiving portion and other end portion of the container that functions as a heat radiating portion, the heat pipe further comprises narrow grooves on the inner surface of the container exposed in the other end portion of the container, both the another wick structure and the wick structure fill an inside of the narrow grooves, in the other end portion which is not covered with neither the wick structure nor the another wick structure, the inner surface of the container where the narrow grooves are formed is exposed, the intermediate portion is covered with the wick structure, the another wick structure has recessed portions and protruding portions, a shape of the recessed portions in the vapor flow path in a cross section in a direction orthogonal to the longitudinal direction of the container has an arc shape, a V shape or a trapezoidal shape, and a thickness of the another wick structure is thicker in the protruding portions than in the recessed portions, a depth of the recessed portions is deeper than a depth of a valley of the narrow grooves of the grooved tube, and a width of the narrow groove widens toward the center of the heat pipe from the bottom of the groove so that the evaporation area for the working fluid in the liquid phase is larger, and a phase change of the working fluid in the liquid phase to the gas phase is promoted.

* * * * *